United States Patent
Yoshinaga et al.

[11] Patent Number: 6,144,044
[45] Date of Patent: *Nov. 7, 2000

[54] GALLIUM PHOSPHIDE GREEN LIGHT-EMITTING DEVICE

[75] Inventors: Atsushi Yoshinaga; Koichi Hasegawa, both of Chichibu, Japan

[73] Assignee: Showa Denko K.K., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/024,558

[22] Filed: Feb. 17, 1998

[30] Foreign Application Priority Data

Feb. 17, 1997 [JP] Japan .................................. 9-032125
Feb. 24, 1997 [JP] Japan .................................. 9-039045
Dec. 24, 1997 [JP] Japan .................................. 9-355363

[51] Int. Cl.⁷ .................................................. H01L 33/00
[52] U.S. Cl. .............................................. 257/94; 438/46
[58] Field of Search .............................. 257/101, 102, 257/103, 94; 117/455; 438/46

[56] References Cited

U.S. PATENT DOCUMENTS 5,529,938   6/1996   Umeda et al. .......................... 437/22

FOREIGN PATENT DOCUMENTS 0 631 330   12/1994   European Pat. Off. .
33 24 220    1/1984   Germany .
57-54951    11/1982   Japan .
6-120561     4/1994   Japan .

OTHER PUBLICATIONS

Stringfellow et al., "Green–Emitting Diodes in Vapor Phase Epitaxial GaP", Solid–State Electronics, 1975, vol. 18, pp. 1019–1028.

Primary Examiner—Olik Chaudhuri
Assistant Examiner—Douglas A. Wille
Attorney, Agent, or Firm—Armstrong, Westerman, Hattori, McLeland & Naughton

[57] ABSTRACT

A GaP green light-emitting diode includes an n-type GaP single-crystal substrate on which is formed at least an n-type GaP layer, a nitrogen-doped n-type GaP layer and a nitrogen-doped p-type GaP layer. The concentration of carbon and/or sulfur in the nitrogen-doped n-type GaP layers is controlled to be not more than $6\times10^{15}$ cm$^{-3}$.

8 Claims, 5 Drawing Sheets

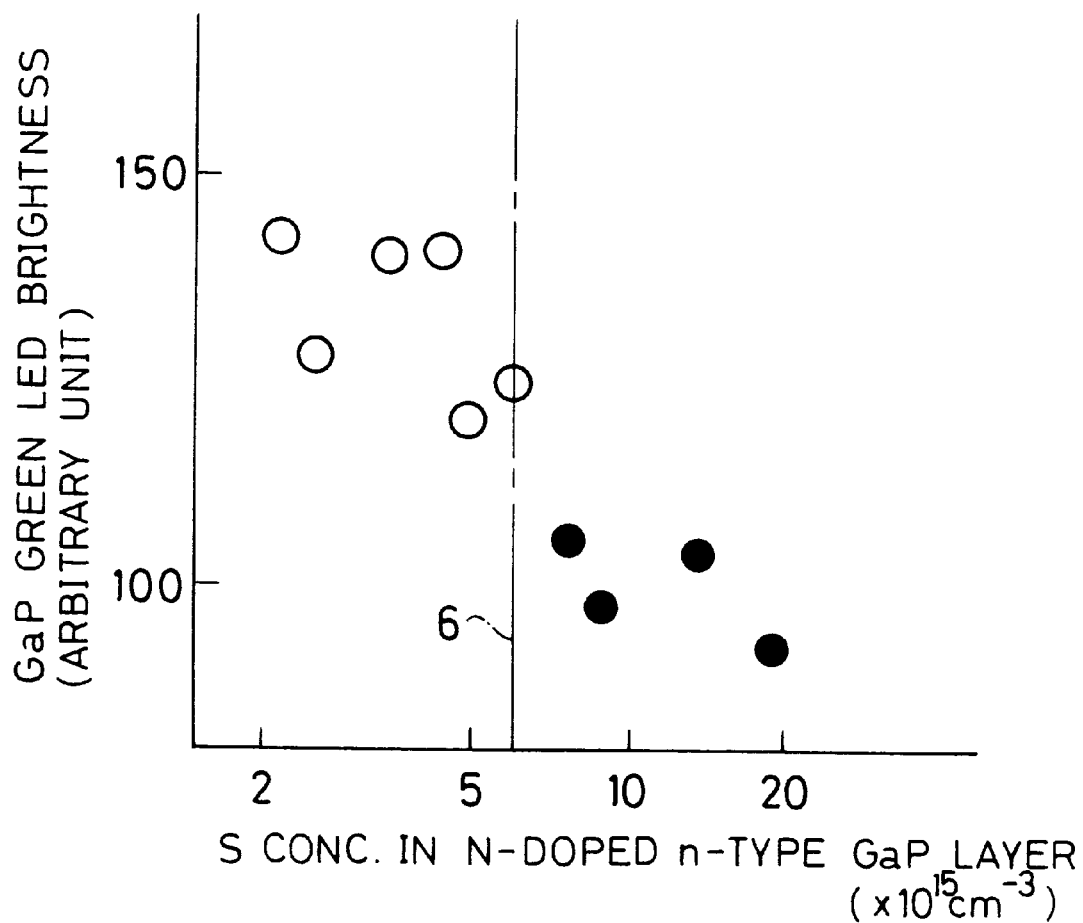

GALLIUM PHOSPHIDE GREEN LIGHT-EMITTING DEVICE

BACKGROUND OF THE INVENTION

1. Field of the Invention

The present invention relates to a green light-emitting device formed of gallium phosphide (GaP). More particularly, the present invention relates to a GaP green light-emitting diode having improved electrical characteristics and/or improved brightness.

2. Description of the Prior Art

GaP light-emitting diodes that emit green light are today extensively used in various display devices. GaP green light-emitting diodes have made startling progress in recent years, with higher brightness types being developed all the time. Along with the increases in brightness, the range of applications for GaP green light-emitting diodes has become very broad. However, in order to expand the range of applications still further, the development of even higher brightness light-emitting diodes is being sought. Moreover, in order to be able to provide a stable supply of low-priced GaP green light-emitting diodes that meet market demand, there is a need to develop light-emitting diodes having a structure that greatly reduces the proportion of faulty products.

FIG. 2(a) shows a general structure of a conventional GaP green light-emitting diode. In FIG. 2(a), reference numeral 11 denotes an n-type GaP single-crystal substrate, 12 is an n-type GaP layer ($n_1$ layer) not doped with nitrogen, 13 is an n-type GaP layer ($n_2$ layer) doped with nitrogen, 14 is a p-type GaP layer, 15 is a p-electrode and 16 is an n-electrode.

In the GaP green light-emitting diode of FIG. 2(a), the n-type GaP single-crystal substrate 11 is of a type generally used, fabricated using the Liquid Encapsulated Czochralski method, doped with an n-type dopant such as S, Te, Si and so forth, and having a donor concentration of about 1 to $20 \times 10^{17}$ cm$^{-3}$.

The GaP layers 12, 13 and 14 are generally fabricated by the liquid phase epitaxial (LPE) growth method. Silicon is normally added as a dopant to the n-type GaP layer ($n_1$ layer) 12 not doped with nitrogen, to provide the layer with a donor concentration of around 0.5 to $10 \times 10^{17}$ cm$^{-3}$. The $n_1$ layer 12 is provided to alleviate adverse affects of substrate crystal defects on the crystallinity of the nitrogen-doped n-type GaP layer 13.

The nitrogen-doped n-type GaP layer ($n_2$ layer) 13 forms the emission layer. To increase the brightness of the GaP green light-emitting diode, it is preferable to reduce the donor concentration of the $n_2$ layer 13, for which reason the donor concentration is usually set at around 1 to $5 \times 10^{16}$ cm$^{-3}$. Silicon is the n-type dopant most usually used for the $n_2$ layer 13. Around $2 \times 10^{18}$ cm$^{-3}$ nitrogen is added to the $n_2$ layer 13 by supplying ammonia gas during the liquid-phase epitaxial growth process.

Zinc or other such p-type dopant is normally added to the p-type GaP layer 14 to set the acceptor concentration at around 5 to $20 \times 10^{17}$ cm$^{-3}$. The p-type GaP layer 14 is usually formed after the $n_2$ layer 13, for which around $2 \times 10^{18}$ cm$^{-3}$ nitrogen is added. FIG. 2(b) shows representative impurity concentration profiles in a GaP green light-emitting diode having the foregoing structure. The composition of the above type of GaP green light-emitting diode is disclosed by, for example, JP-B Sho 57-54951.

The GaP green light-emitting diode is fabricated by using LPE to epitaxially grow the above GaP layers on the n-type GaP single-crystal substrate, thereby forming an epitaxial wafer, and gold alloys such as AuGe or AuSi, and AuBe or AuZn are then formed on the n-type and p-type sides, respectively, of the epitaxial wafer by vapor deposition, heat treatment and photolithography, to thereby form the p-electrode 15 and n-electrode 16 shown in FIG. 2(a). The wafer is then separated into the individual devices.

In JP-B Sho 57-54951, the reason for the need to reduce the donor concentration in the nitrogen-doped n-type GaP layer of the GaP green light-emitting diode to obtain higher brightness is described as being because there is a reverse correlation between the donor concentration and the nitrogen atomic concentration both in the n-type GaP layer, so that the nitrogen atomic concentration can be raised by lowering the donor concentration. Namely, the nitrogen in the GaP layer functions as an emission center. Also, in the GaP green light-emitting diode, the emission layer is the $n_2$ layer. Thus, the brightness of the light-emitting diode can be increased by lowering the donor concentration in the $n_2$ layer to raise the nitrogen concentration.

The present inventors conducted various experiments and studies aimed at developing GaP green light-emitting diodes having a structure that minimizes the proportion of those having defective properties, especially defective electrical characteristics. One electrical characteristic defect in conventional GaP green light-emitting diodes has been the formation of thyristors. That is, for some reason, in a certain proportion of conventional GaP green light-emitting diodes fabricated by the LPE method, a pnpn structure (thyristor) has arisen, causing negative resistance to be exhibited in the electrical characteristics, thereby rendering the diodes defective.

The present inventors first elucidated what causes such thyristors to be produced. This started with an analysis of the device structure that becomes a thyristor. That structure is illustrated by FIG. 3(a). In FIG. 3(a), reference numerals 31, 32, 33, 34, 35 and 36 correspond to the single-crystal substrate 11, n-type GaP layer 12 not doped with nitrogen, n-type GaP layer 13 doped with nitrogen, p-type GaP layer 14, p-electrode 15 and n-electrode 16 of FIG. 2(a). The thyristor in FIG. 3(a) has a p-type GaP inversion layer 37 formed in a portion of the nitrogen-doped n-type GaP layer ($n_2$ layer) 33 in the vicinity of the interface between the n-type GaP layer ($n_1$ layer) 32 not doped with nitrogen and the $n_2$ layer 33. This is the difference between this diode and the normal GaP green light-emitting diode shown in FIG. 2(a). Thus, it is found that devices that become thyristors have a pnpn structure.

To analyze what causes the p-type GaP inversion layer 37 to be formed, secondary ion mass spectrometry (SIMS) was used to investigate the depth profile of impurity concentration in thyristor devices. FIG. 3(b) shows a representative distribution of the impurity concentration in a thyristor device. As shown, in the p-type GaP inversion layer 37 the concentration of carbon, the acceptor impurity, is higher than that of the silicon constituting the donor impurity. The portion of the $n_2$ layer in the vicinity of the interface between the $n_1$ layer and the $n_2$ layer where the carbon concentration is higher than the silicon concentration forms a p-type GaP inversion layer that becomes the pnpn structure.

To improve the brightness of the GaP green light-emitting diodes, the donor concentration of the $n_2$ layer is normally set at a lower level compared to the $n_1$ layer. Since the segregation coefficient of the silicon which is the main donor impurity of the $n_2$ layer has a negative temperature dependency, the concentration of the silicon in the GaP epitaxial layer decreases in portions grown at high temperature and increases in portions grown at low temperature. This means that even in the $n_2$ layer, the silicon concentration is lower in the vicinity of the interface with the $n_1$ layer, and higher in the vicinity of the interface with the p-type GaP layer. In GaP green light-emitting diodes the concentration of the donor impurity in the $n_2$ layer is generally around 1 to $3 \times 10^{16}$ cm$^{-3}$ in the vicinity of the interface with the $n_1$ layer, and around 2 to $5 \times 10^{16}$ cm$^{-3}$ in the vicinity of the interface with the p-type GaP layer. This being the case, when the background level content of the carbon in the GaP layer is around 8 to $20 \times 10^{16}$ cm$^{-3}$, as in a conventional diode, a p-type inversion layer may be formed within the $n_2$ layer in the region of the interface with the $n_1$ layer, producing a thyristor.

A first object of the present invention is to provide a GaP green light-emitting diode having a structure that reduces to very low levels the incidence of electrical characteristic defects caused by thyristors.

The present inventors also carried out experiments and studies aimed at meeting the demand for even higher brightness GaP green light-emitting diodes.

It has heretofore been known that at or above the conventional donor concentration of $1 \times 10^{16}$ cm$^{-3}$, there is a correlation between the donor concentration in the $n_2$ emission layer and the diode brightness, and that reducing the donor concentration in the $n_2$ layer can be used to raise the brightness of the diode. The conventional method used to decrease the donor level in the n-type GaP layer doped with nitrogen was to not add donor impurity to the $n_2$ layer intentionally.

When donor impurity is not added to the $n_2$ layer intentionally, the donor concentration in the $n_2$ layer is mainly determined by (1) the donor impurity eluted from the substrate into the Ga solution used in the epitaxial growth process, and (2) the amount of silicon produced by reduction of the quartz (SiO$_2$) of the reaction tube in the epitaxial growth furnace with the hydrogen gas and mixed in with the Ga solution. When the $n_2$ layer is being grown, the silicon included in the Ga solution as a result of the reduction, reacts with the nitrogen to form Si$_3$N$_4$, the major portion being removed by the Ga solution. As a result, the concentration of the silicon taken into the $n_2$ layer becomes about 1 to $2 \times 10^{16}$ cm$^{-3}$. When the n-type dopant of the substrate is sulfur, the concentration of sulfur in the $n_2$ layer as a result of the elution of sulfur from the substrate is about 1 to $3 \times 10^{16}$ cm$^{-3}$.

The elution of the sulfur from the substrate has been the main reason for not being able to reduce the donor concentration in the $n_2$ layer. To counter this, JP-A Hei 6-120561 describes providing an n-type GaP buffer layer doped with Te or the like between the substrate and the $n_1$ layer, and lowering the sulfur concentration in the buffer layer to minimize the amount of sulfur entering the $n_2$ layer from the substrate. In the GaP green light-emitting diode thus obtained, the main donor impurity in the nitrogen-doped n-type GaP layer is silicon, in a concentration of around 1 to $2 \times 10^{16}$ cm$^{-3}$. The $n_2$ layer has a sulfur concentration of around $1 \times 10^{16}$ cm$^{-3}$.

The present inventors carried out further studies aimed at improving the brightness of GaP green light-emitting diodes. As a result, it was found when the sulfur concentration in the nitrogen-doped n-type GaP layer was reduced in accordance with the method described by JP-A Hei 6-120561, both silicon and sulfur coexisted in the nitrogen-doped n-type GaP layer, but that even when silicon became the main donor impurity, the sulfur in the layer had an effect on the brightness exhibited by the diode. That is, even when the nitrogen-doped n-type GaP layer contained around 1 to $2 \times 10^{16}$ cm$^{-3}$ silicon and around $1 \times 10^{16}$ cm$^{-3}$ sulfur, the sulfur concentration altered the brightness of the GaP green light-emitting diode, with lower sulfur resulting in higher brightness.

A second object of the present invention is to provide a GaP green light-emitting diode having improved brightness, by suppressing the entry of sulfur into the nitrogen-doped n-type GaP layer ($n_2$ layer) to obtain an $n_2$ layer in which the concentration of sulfur is kept to not more than $6 \times 10^{15}$ cm$^{-3}$ on the basis of the fact that in the region of the $n_2$ layer having a sulfur concentration of not more than $1 \times 10^{16}$ cm$^{-3}$, the sulfur concentration in the $n_2$ layers and the light-emitting diode brightness have a correlation.

SUMMARY OF THE INVENTION

The invention achieves the first object by providing a GaP green light-emitting diode comprising an n-type GaP single-crystal substrate, and at least an n-type GaP layer, a nitrogen-doped n-type GaP layer and a p-type GaP layer that are formed on the substrate in the order mentioned, wherein a concentration of carbon in the nitrogen-doped n-type GaP layer is not more than $6 \times 10^{15}$ cm$^{-3}$.

As described in the foregoing, while a p-type inversion layer may be formed within the $n_2$ layer in the region of the interface with the $n_1$ layer when the background level content of the carbon in the GaP layer is around 8 to $20 \times 10^{15}$ cm$^{-3}$, formation of the p-type inversion layer may be suppressed by using an $n_2$ layer carbon concentration that is not more than $6 \times 10^{15}$ cm$^{-3}$, reducing the carbon concentration of the $n_2$ layer in the vicinity of the interface between the $n_2$ layer and the $n_1$ layer to below the silicon concentration.

The invention achieves the second object by providing a GaP green light-emitting diode comprising an n-type GaP single-crystal substrate, and at least an n-type GaP layer, a nitrogen-doped n-type GaP layer and a p-type GaP layer that are formed on the substrate in the order mentioned, wherein a concentration of sulfur in the nitrogen-doped n-type GaP layer is not more than $6 \times 10^{15}$ cm$^{-3}$.

Thus, when silicon and sulfur coexist in the nitrogen-doped n-type GaP layer the sulfur has an effect on the brightness of the light-emitting diode, so that by suppressing the inclusion of sulfur to keep the sulfur concentration to not more than $6 \times 10^{15}$ cm$^{-3}$, the brightness of the diode is improved by the degree the sulfur concentration is reduced.

The invention also comprises the above gallium phosphide green light-emitting diode in which the carbon concentration in the nitrogen-doped n-type GaP layer is not more than $6 \times 10^{15}$ cm$^{-3}$ and the sulfur concentration is not more than $6 \times 10^{15}$ cm$^{-3}$.

By thus keeping the carbon concentration in the nitrogen-doped n-type GaP layer to not more than $\times 10^{15}$ cm$^{-3}$ and the sulfur concentration to not more than $6 \times 10^{15}$ cm$^{-3}$, the formation of thyristors is suppressed, enabling GaP green light-emitting diodes having improved brightness to be obtained with a higher yield.

The concentration of silicon in the nitrogen-doped n-type GaP layer is specified as being within the range of 1 to $2 \times 10^{16}$ cm$^{-3}$, which is desirable as effectively suppressing the formation of thyristors in GaP green light-emitting diodes in which brightness is improved by reducing the sulfur concentration.

The above and other objects and features of the present invention will become apparent from the following description made with reference to the drawings.

BRIEF EXPLANATION OF THE DRAWINGS

FIG. 4 shows the relationship between brightness and the concentration of sulfur in a nitrogen-doped n-type GaP layer in a GaP green light-emitting diode.

DESCRIPTION OF THE PREFERRED EMBODIMENT

To attain the first object, the present inventors elucidated a source of carbon intrusion into the $n_2$ layer. The source of the carbon is considered to be graphite material of the epitaxial growth apparatus and carbon contained as an impurity in the basic materials. The inventors replaced the graphite used in the epitaxial growth apparatus with quartz ($SiO_2$) and boron nitride (BN) and examined how this changed the carbon concentration in the GaP epitaxial layers. However, it was found that GaP epitaxial layers grown in an apparatus using quartz or boron nitride had a carbon concentration that was substantially the same as that in GaP layers grown in an apparatus using graphite. This indicated that the main source of the carbon in the GaP epitaxial layers was not the graphite of the epitaxial growth apparatus.

Figure 1:
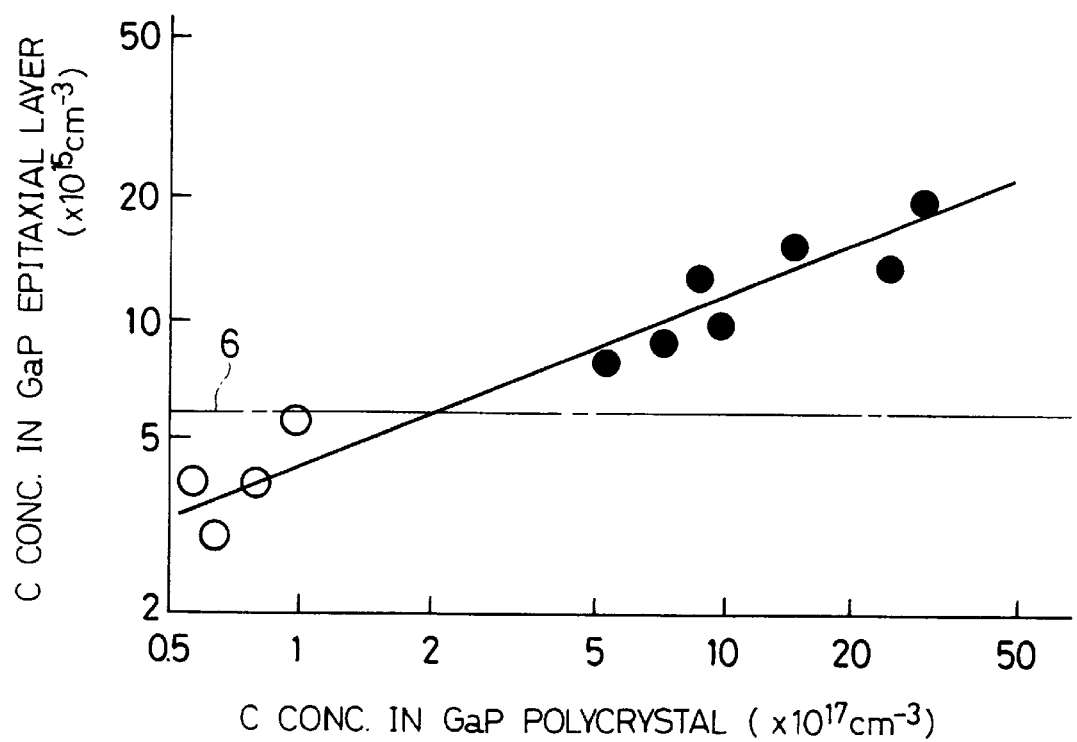
FIG. 1 is a graph showing the relationship between carbon concentration in GaP polycrystal, and the carbon concentration in GaP epitaxial layers using the GaP polycrystal.

The inventors next shifted the focus of their investigation to carbon contained as an impurity in the basic materials used to grow the GaP epitaxial layers. This revealed that there was a correlation between the carbon impurity contained in the GaP polycrystal used as the basic material, and the carbon concentration in the GaP epitaxial layers, as indicated in FIG. 1 by the solid bullets (●). This showed that the carbon concentration in the GaP epitaxial layers could be reduced by reducing the carbon concentration in the GaP polycrystal.

The inventors then conducted studies starting with the method used to produce the GaP polycrystal used as the basic material to grow the GaP epitaxial layers. At 800 to 1000° C. at which GaP layers are grown by liquid-phase epitaxy, almost none of the graphite of the epitaxial growth apparatus melts into the Ga epitaxial growth solution. However, at the higher temperature of around 1500° C. used to produce the GaP polycrystal, it would be possible that some of the carbon from the graphite vessel used to grow the polycrystal melts into the molten GaP, resulting in the carbon content of 5 to $30 \times 10^{17}$ $cm^{-3}$ found in conventional GaP polycrystal.

The inventors therefore changed the graphite vessel to a pyrolytic boron nitride (PBN) vessel, which resulted in a GaP polycrystal carbon concentration of $1 \times 10^{17}$ $cm^{-3}$ or less, markedly lower than the previous 5 to $30 \times 10^{17}$ $cm^{-3}$. By using this GaP polycrystal having a reduced concentration of carbon impurity as the starting material for growing the GaP epitaxial layers, it was possible to reduce the carbon concentration in the $n_2$ layer from the conventional 8 to $20 \times 10^{15}$ $cm^{-3}$ to $6 \times 10^{15}$ $cm^{-3}$ or less (below the chain line 6), as indicated in FIG. 1 by the hollow bullets (○).

FIG. 1 shows the relationship between the carbon concentration in the GaP polycrystal and the carbon concentration in GaP epitaxial layers formed using the GaP polycrystal. In the figure, the solid black bullets indicate the carbon concentration in GaP polycrystal conventionally formed using a graphite vessel, and the carbon concentration in the GaP epitaxial layers formed using the GaP polycrystal, and the hollow bullets indicate the carbon concentration in GaP polycrystal formed in accordance with the improved GaP polycrystal production process of this invention using a PBN vessel, and the carbon concentration in the GaP epitaxial layers formed using that GaP polycrystal.

Based on these findings, the inventors were able to produce GaP green light-emitting diodes with substantially zero incidence of thyristors by keeping the concentration of carbon in the $n_2$ layer to not more than $6 \times 10^{15}$ $cm^{-3}$ to thereby prevent the formation of a p-type inversion layer in the $n_2$ layer in the vicinity of the interface with the $n_1$ layer.

To attain the second object of the invention, the inventors conducted research relating to reducing the concentration of sulfur in the nitrogen-doped n-type GaP layers. With the conventional method in which a buffer layer is used to prevent substrate sulfur entering the $n_2$ layer, it was not possible to reduce the sulfur concentration to or below $6 \times 10^{15}$ $cm^{-3}$, the lowest attainable level being in the order of 0.7 to $1 \times 10^{16}$ $cm^{-3}$.

Various sulfur intrusion sources were considered to elucidate why the sulfur concentration in the nitrogen-doped n-type GaP layer could not be reduced to $6 \times 10^{15}$ $cm^{-3}$. As a result, it was established that the main source of the sulfur in the nitrogen-doped n-type GaP layer was the basic material used to epitaxially grow the GaP layer. The inventors focused on the GaP layer epitaxial growth material used, especially the Ga, using a purity of at least 99.9999% and, prior to its use in the epitaxial growth process, subjecting it to baking treatment at 1050° C. in a reduced-pressure atmosphere or a hydrogen atmosphere.

In addition, the high-purity commercial grade hydrogen, argon or other gases used in the epitaxial growth process were refined to further enhance their purity before being supplied to the reaction furnace. Furthermore, for the graphite used in the epitaxial growth apparatus, high-purity graphite was used, and before being actually employed, was subjected to purification treatment by baking it at 1200° C. in an atmosphere of HCl gas. Also prior to use, the GaP single-crystal substrate was processed using high-purity etchants and thoroughly washed with ultrapure water. The overall result of these measures was that for the first time, it became possible to control the sulfur concentration in the nitrogen-doped n-type GaP layer to not more than $6 \times 10^{15}$ $cm^{-3}$.

The hollow bullets in FIG. 4 show the relationship between the brightness and the sulfur concentration in the nitrogen-doped n-type GaP layer in a GaP green light-emitting diode in which the concentration of sulfur in the nitrogen-doped n-type GaP layer has been reduced to not more than $6 \times 10^{15}$ $cm^{-3}$ by the above methods. In FIG. 4, the solid bullets indicate the relationship between the brightness and the sulfur concentration in the nitrogen-doped n-type GaP layer in a GaP green light-emitting diode obtained by the conventional method, in which the concentration of sulfur in the nitrogen-doped n-type GaP layer is more than $7 \times 10^{15}$ cm$^{-3}$.

As revealed by FIG. 4, there is a correlation between the concentration of sulfur in the nitrogen-doped n-type GaP layer and brightness when the sulfur concentration is in the range of 2 to $20 \times 10^{15}$ cm$^{-3}$. By controlling the sulfur concentration to not more than $6 \times 10^{15}$ cm$^{-3}$ (the left side of the chain line 6), the brightness of the resulting light-emitting diodes was improved by 20 to 50% or more, compared to GaP green light-emitting diodes having a sulfur concentration of 7 to $20 \times 10^{15}$ cm$^{-3}$. The GaP green light-emitting device according to the present invention is the first one in which the concentration of sulfur in the nitrogen-doped n-type GaP layer is not more than $6 \times 10^{15}$ cm$^{-3}$.

Moreover, based on the above results, it was possible to obtain GaP green light-emitting diodes exhibiting higher brightness than conventional GaP green light-emitting diodes and a much lower incidence of thyristors, by reducing the carbon concentration in the nitrogen-doped n-type GaP layer to not more than $6 \times 10^{15}$ cm$^{-3}$ and also reducing the sulfur concentration to not more than $6 \times 10^{15}$ cm$^{-3}$.

It is preferable for the silicon concentration in the nitrogen-doped n-type GaP layer to be from 1 to $2 \times 10^{16}$ cm$^{-3}$. If the silicon concentration is higher than $2 \times 10^{16}$ cm$^{-3}$, the high donor concentration in the n-type GaP layer will tend to degrade the brightness of the resulting GaP green light-emitting diode. Conversely, if the silicon concentration in the nitrogen-doped n-type GaP layer is less than $1 \times 10^{16}$ cm$^{-3}$ in conjunction with the concentration of sulfur in the n-type GaP layer being controlled to not more than $6 \times 10^{15}$ cm$^{-3}$, the donor concentration in the n-type GaP layer may be too low, possibly resulting in the formation of a p-type inversion layer in the n-type GaP layer.

The mechanism by which the brightness of the GaP green light-emitting diode is dictated by the concentration of sulfur in the $n_2$ layer is not known. SIMS is an example of a method that can be used to measure the concentration of sulfur and other GaP layer impurities.

The invention is described in detail below with reference to examples. However, the invention is not limited by these examples.

EXAMPLE 1

Figure 5:
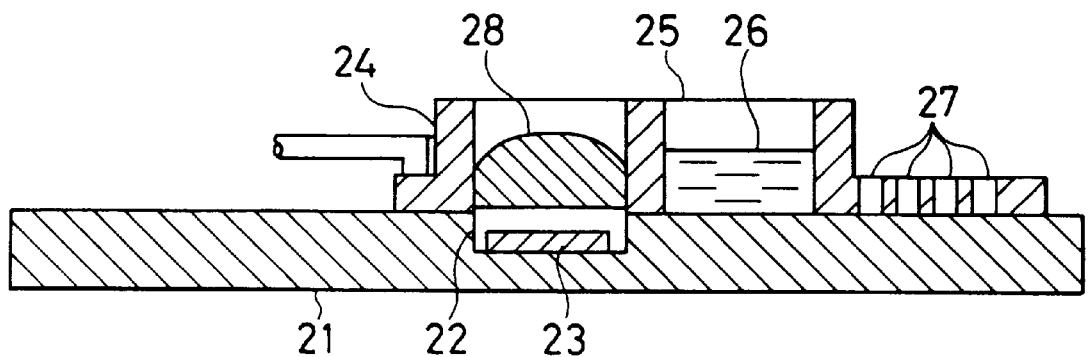
FIG. 5 is a diagram of a slide boat type growth apparatus used to grow the GaP epitaxial layer.

Using the methods described below, GaP green light-emitting diodes according to the invention were fabricated by forming an n-type GaP layer not doped with nitrogen, a nitrogen-doped n-type GaP layer and a p-type GaP layer in the order mentioned on an n-type GaP single-crystal substrate. FIG. 5 is a general view of the slide boat growth apparatus used to grow these GaP epitaxial layers. In FIG. 5, reference numeral 21 denotes a substrate holder boat, 22 is a substrate recess, 23 is a n-type GaP single-crystal substrate, 24 is a slider containing the Ga solution, 25 is a solution reservoir, 26 is the Ga solution, 27 are holes, and 28 is a cover. A graphite slide boat growth apparatus was used.

First, the n-type GaP single-crystal substrate 23 was placed in the substrate recess 22 and the Ga solution 26 to which GaP polycrystal was added was placed in the solution reservoir 25, separated as shown in FIG. 5, and the apparatus was then placed in the reaction furnace that used a quartz reaction tube. GaP polycrystal was used in which the carbon concentration had been reduced to not more than $1 \times 10^{17}$ cm$^{-3}$ by using a PBN vessel in the production process.

The atmosphere in the reaction furnace was replaced by hydrogen and the temperature in the furnace was raised to 1050° C. The growth apparatus was baked at 1050° C. for one hour to melt the GaP polycrystal in the Ga solution, forming a GaP-saturated Ga solution. After the baking, the temperature of the furnace was reduced to 1000° C., and after the temperature had stabilized, the slider 24 was slid to bring the n-type GaP single-crystal substrate 23 and Ga solution 26 into contact, and the slider 24 was moved further until part of the Ga solution 26 was over the n-type GaP single-crystal substrate 23 and the portion having the holes 27 was above the substrate.

After this state was maintained for five minutes, the temperature of the furnace was reduced to 950° C. at a rate of 1.5° C./min. During this cooling step the n-type GaP layer not doped with nitrogen ($n_1$ layer) was formed on the GaP single-crystal substrate 23. Dopant used for the layer was silicon formed by the reduction of the quartz by the hydrogen gas and included in the Ga solution. The $n_1$ layer had a thickness of approximately 10 μm and a donor concentration of 1 to $2 \times 10^{17}$ cm$^{-3}$.

After the furnace temperature reached 950° C., the temperature was maintained for about 60 minutes. Coinciding with the start of this 60-minute period, the atmosphere in the furnace was replaced by argon gas to which ammonia (NH$_3$) was added. Thus, via the holes 27 the ammonia gas reacted with the Ga solution 26, thereby incorporating nitrogen in the Ga solution. Part of this nitrogen reacted with the silicon in the Ga solution, forming Si$_3$N$_4$. As a result, the concentration of the silicon in the Ga solution was greatly reduced.

After the temperature had been maintained at 950° C. for 60 minutes, the furnace was cooled to 900° C. at 1.5° C./min. The nitrogen-doped n-type GaP layer ($n_2$ layer) was formed during this cooling step. As a result of the aforementioned major reduction in the concentration of silicon in the Ga solution, the donor concentration in the nitrogen-doped n-type GaP layer was lowered to around 1 to $5 \times 10^{16}$ cm$^{-3}$. The thickness of the $n_2$ layer was approximately 10 μm.

After the furnace temperature reached 900° C., the temperature was maintained for about 30 minutes. Coinciding with the start of that period, zinc vapor was supplied to the furnace via the atmosphere gas. This resulted in the inclusion of zinc in the Ga solution by contact between the zinc vapor and the Ga solution, via the holes 27. The temperature of the furnace is then cooled to 800° C. at the rate of 1.5° C./min, thereby forming the nitrogen-doped p-type GaP layer on the nitrogen-doped n-type GaP layer. The acceptor concentration of the p-type GaP layer was approximately 5 to $20 \times 10^{17}$ cm$^{-3}$, and the layer was about 20 μm thick.

Figure 2A:
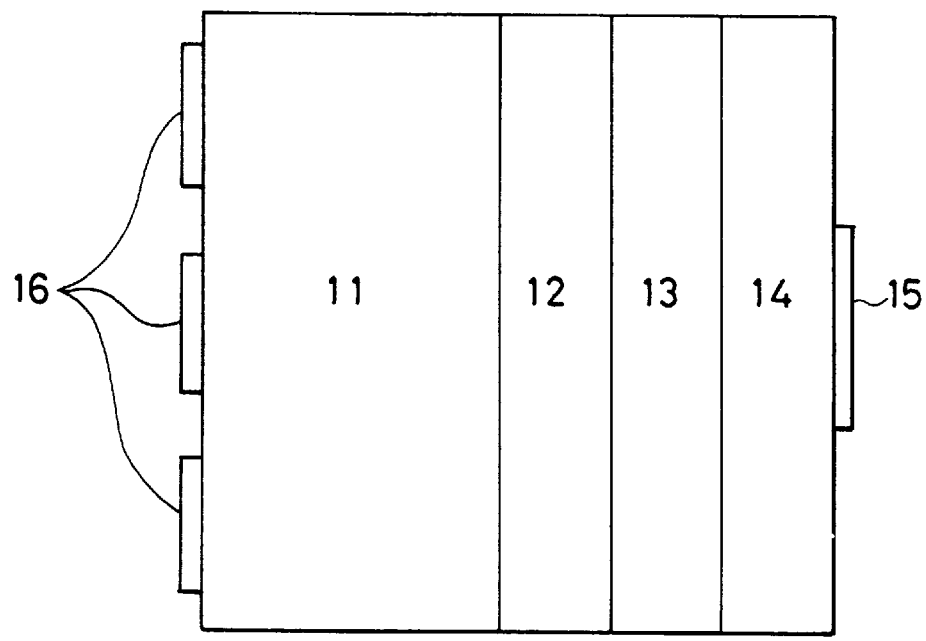
FIG. 2(a) is a diagram illustrating the structure of a conventional GaP green light-emitting diode and GaP green light-emitting diodes of Example 1 and Comparative Example 1.
Figure 2B:
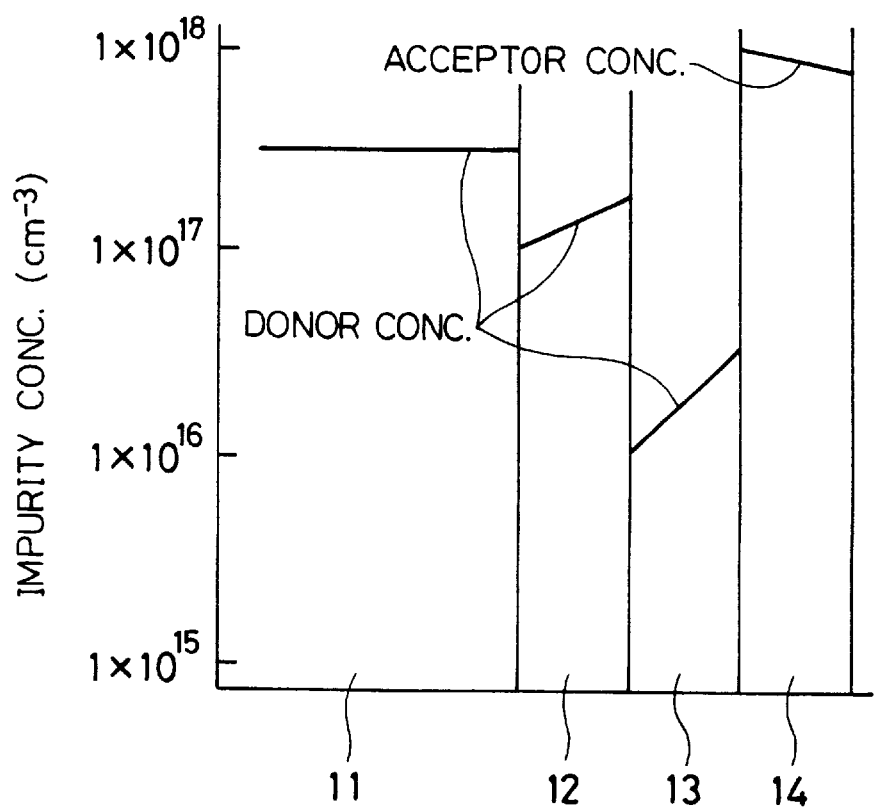
FIG. 2(b) shows the profile of the impurity concentration in a conventional GaP green light-emitting diode.
Figure 3A:
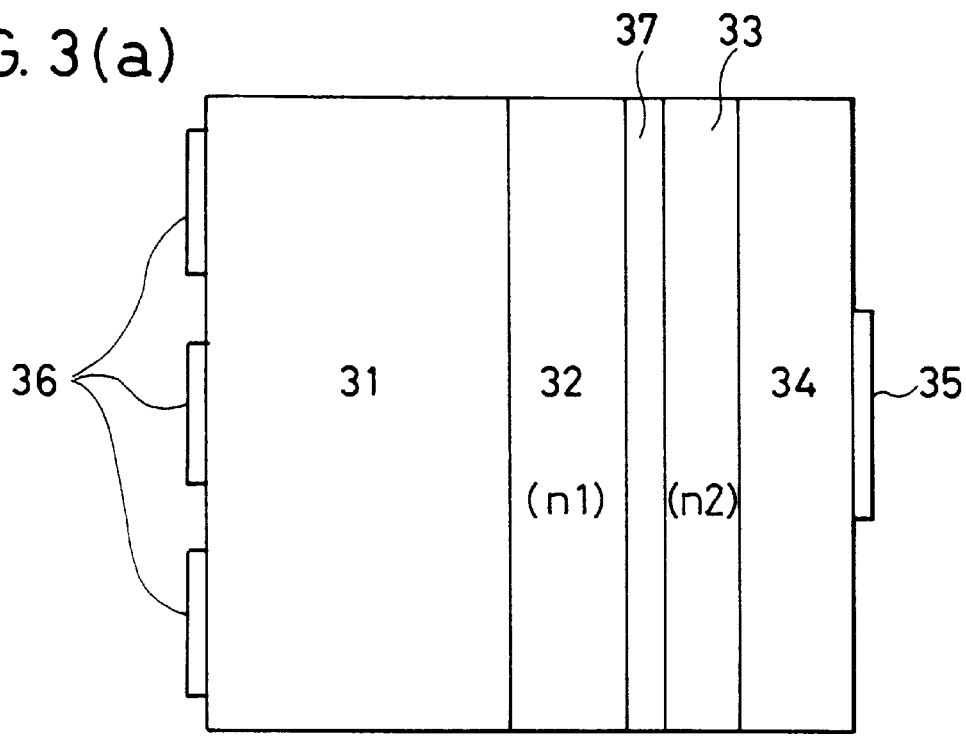
FIG. 3(a) is a diagram of the structure of a thyristor device.
Figure 3B:
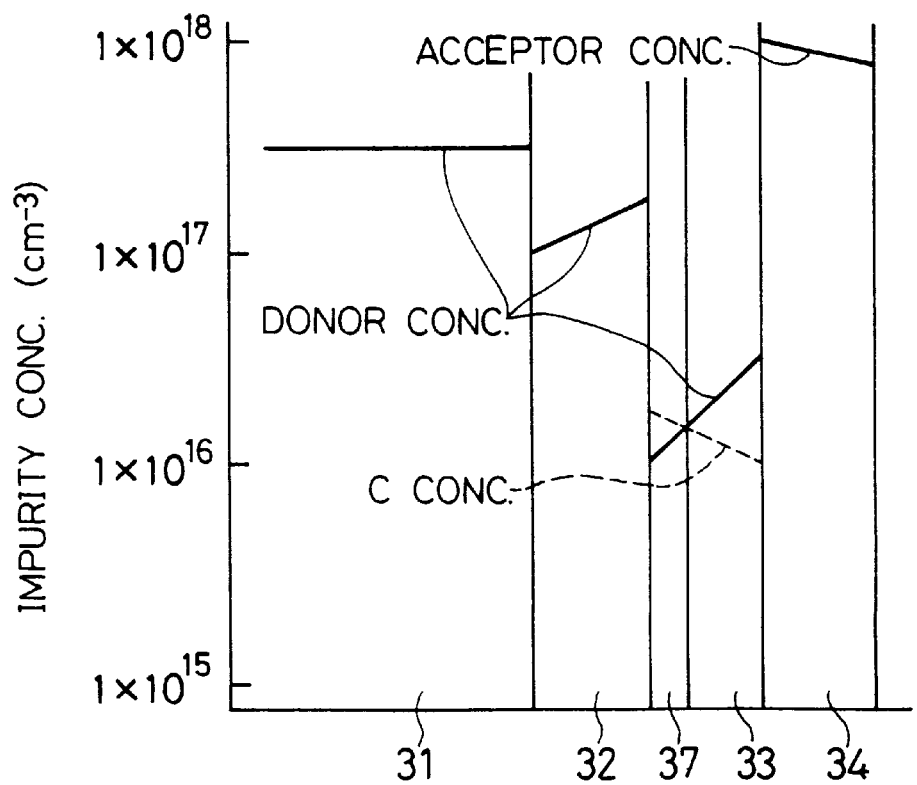
FIG. 3(b) shows the profile of the impurity concentration in the thyristor device.

The power to the furnace heater was then switched off to allow the furnace to spontaneously cool to room temperature. After the substrate had cooled, the epitaxial wafer thus fabricated was removed from the furnace, and AuGe was deposited on the n-type side and AuBe was deposited on the p-type side, followed by heat treatment and photolithography, to form a p-electrode and an n-electrode. The wafer was then separated into the individual devices. The structure of the GaP green light-emitting diode thus fabricated was the same as that shown in FIG. 2(a).

The donor impurity concentration in the $n_2$ layer of the GaP green light-emitting diode obtained in accordance with Example 1 was in the order of 1 to $3 \times 10^{16}$ cm$^{-3}$ in the vicinity of the interface with the $n_1$ layer, and around 2 to $5 \times 10^{16}$ cm$^{-3}$ in the vicinity of the interface with the p-type GaP layer. The concentration of the carbon in the $n_2$ layer was around 3 to $6\times10^{15}$ cm$^{-3}$. Out of one million GaP green light-emitting diodes thus fabricated in accordance with Example 1, there were zero thyristors.

COMPARATIVE EXAMPLE 1

The same procedure as in Example 1 was used to fabricate GaP green light-emitting diodes. However, in the case of Comparative Example 1 the GaP epitaxial layers were grown using GaP polycrystal produced in a conventional graphite vessel, and had a carbon concentration of approximately 5 to $30\times10^{17}$ cm$^{-3}$.

The donor impurity concentration in the $n_2$ layer of the GaP green light-emitting diode obtained in accordance with Comparative Example 1 was in the order of 1 to $3\times10^{16}$ cm$^{-3}$ in the vicinity of the interface with the $n_1$ layer, and around 2 to $5\times10^{16}$ cm$^{-3}$ in the vicinity of the interface with the p-type GaP layer. The concentration of the carbon in the $n_2$ layer was around 8 to $20\times10^{15}$ cm$^{-3}$. Out of one million GaP green light-emitting diodes thus fabricated in accordance with Comparative Example 1, there were approximately 300 thyristors.

EXAMPLE 2

The methods described below were used to fabricate GaP green light-emitting diodes according to Example 2 of the invention. First, an n-type GaP buffer layer was formed on an n-type GaP single-crystal substrate to which Te was added as the donor impurity, resulting in a donor concentration of around 2 to $10\times10^{17}$ cm$^{-3}$. The buffer layer was formed as follows. A Ga solution in which GaP polycrystal and Te as the n-type dopant were melted at 1060° C. was placed on the n-type GaP single-crystal substrate. This Ga solution was a GaP saturated solution at 1060° C. to which Te was added to produce a donor concentration in the n-type GaP buffer layer of 0.5 to $10\times10^{17}$ cm$^{-3}$.

Using a growth atmosphere of hydrogen gas, the temperature of the system including the aforementioned Ga solution was gradually lowered to precipitate the GaP in the Ga solution on the n-type GaP single-crystal substrate, thereby forming the Te-doped n-type GaP buffer layer on the n-type GaP single-crystal substrate. The buffer layer was approximately 70 μm thick.

The same methods used in Example 1 were then used to form on the n-type GaP single-crystal substrate with the n-type GaP buffer layer, an n-type GaP layer not doped with nitrogen, a nitrogen-doped n-type GaP layer and a p-type GaP layer in the order mentioned. However, in the case of Example 2 the n-type GaP layer not doped with nitrogen, nitrogen-doped n-type GaP layer and p-type GaP layer were formed using GaP polycrystal produced in a conventional graphite vessel and having a carbon concentration of approximately 5 to $30\times10^{17}$ cm$^{-3}$.

Figure 6:
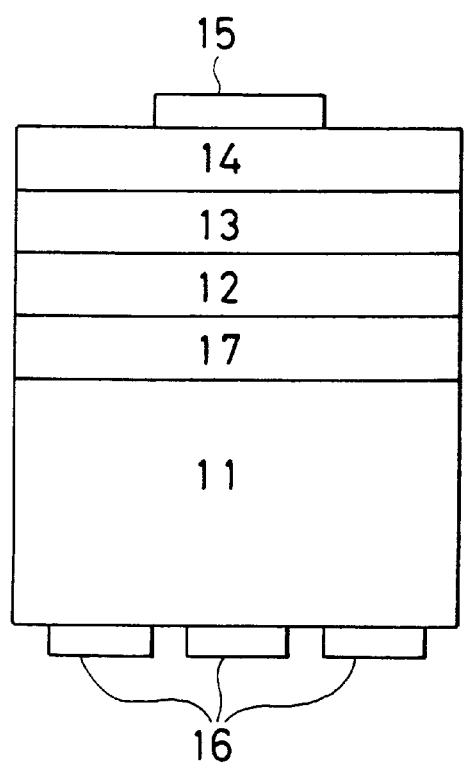
FIG. 6 shows the structure of GaP green light-emitting diodes relating to Examples 2 and 3 and Comparative Example 2.

The epitaxial wafer thus fabricated was provided with an n-type electrode and p-type electrode formed by depositing AuGe on the n-type side and AuBe on the p-type side, followed by heat treatment and photolithography. The wafer was then divided into square devices measuring 300 μm on each side. FIG. 6 shows the structure of the GaP green light-emitting diodes thus fabricated. In FIG. 6, the parts denoted by reference numerals 11 to 16 are the same as the parts thus numbered in FIG. 2(a). Reference numeral 17 denotes the n-type GaP buffer layer.

All means were used to reduce the concentration of sulfur in the nitrogen-doped n-type GaP layer ($n_2$ layer) of the diodes of Example 2. Namely, high-purity materials were used, the atmospheric gas used was refined, the substrate was cleaned using high-purity chemicals and ultrapure water, and the growth apparatus was subjected to purification treatment. Thus, the donor impurity concentration in the $n_2$ layer of the GaP green light-emitting diodes obtained in accordance with Example 2 was in the order of 1 to $2\times10^{16}$ cm$^{-3}$ in the case of silicon and 2 to $6\times10^1$ cm$^{-3}$ in the case of sulfur. Diode brightness was 10 to 20 mcd (average of 15 mcd) at a forward current of 20 mA.

COMPARATIVE EXAMPLE 2

The same procedure as in Example 2 was used to fabricate GaP green light-emitting diodes. However, in the case of Comparative Example 2 the GaP epitaxial layers were grown without using the means described above to reduce the concentration of sulfur in the $n_2$ layer. The donor impurity concentration in the $n_2$ layer of the GaP green light-emitting diodes obtained in accordance with Comparative Example 2 was in the order of 1 to $2\times10^{16}$ cm$^{-3}$ in the case of silicon and approximately $1\times10^{16}$ cm$^{-3}$ in the case of sulfur. Diode brightness was 7 to 15 mcd (average of 10 mcd) at a forward current of 20 mA.

EXAMPLE 3

GaP green light-emitting diodes were fabricated by the same methods used in Example 2. However, in the case of Example 3 the n-type GaP layer not doped with nitrogen, nitrogen-doped n-type GaP layer and p-type GaP layer were formed using GaP polycrystal produced in a PBN vessel and having a carbon concentration of not more than $1\times10^{17}$ cm$^{-3}$. The donor impurity concentration in the $n_2$ layer of the GaP green light-emitting diodes obtained in accordance with Example 3 was in the order of 1 to $2\times10^{16}$ cm$^{-3}$ in the case of silicon and 2 to $6\times10^{15}$ cm$^{-3}$ in the case of sulfur. The carbon concentration in the $n_2$ layer was in the order of 3 to $6\times10^{15}$ cm$^{-3}$. Out of one million GaP green light-emitting diodes thus fabricated in accordance with Example 3, there were zero thyristors. Diode brightness was 10 to 20 mcd (average of 15 mcd) at a forward current of 20 mA.

In accordance with this invention, formation of a p-type inversion layer in the $n_2$ layer in the vicinity of the interface with the $n_1$ layer is prevented by using as the epitaxial growth material GaP polycrystal in which the carbon concentration has been reduced, decreasing the carbon concentration in the nitrogen-doped n-type GaP layer ($n_2$ layer) to not more than $6\times10^{15}$ cm$^{-3}$, compared to the conventional level of around 8 to $20\times10^1$ cm$^{-3}$. As a result, the incidence of thyristors in the GaP green light-emitting diodes thus obtained is virtually zero. In addition to making it possible to greatly reduce the rate of defective GaP green light-emitting diodes produced, this makes it possible to eliminate the step of inspecting diodes for the existence of defect thyristors, so the effect of the invention is considerable.

Another result of being able to obtain GaP green light-emitting diodes in which the sulfur concentration in the nitrogen-doped n-type GaP layer ($n_2$ layer) is controlled to not more than $6\times10^{15}$ cm$^{-3}$ is that diode brightness is improved by 20 to 50% compared to conventional GaP green light-emitting diodes in which the sulfur concentration in the nitrogen-doped n-type GaP layer is in the order of $1\times10^{16}$ cm$^{-3}$. Moreover, by reducing the concentration of carbon in the $n_2$ layer to not more than $6\times10^{15}$ cm$^{-3}$ and controlling the concentration of sulfur in the $n_2$ layer also to not more than $6\times10^{15}$ cm$^{-3}$, thyristor formation is virtually eliminated and high-brightness GaP green light-emitting diodes can be obtained.

What is claimed is:

1. A GaP green light-emitting diode comprising an n-type GaP single-crystal substrate, and at least an n-type GaP layer, a nitrogen-doped n-type GaP layer and a p-type GaP layer that are formed on the substrate in the order mentioned, wherein a concentration of carbon in the nitrogen-doped n-type GaP layer is not more than $6 \times 10^{15}$ cm$^{-3}$, and an acceptor concentration of the p-type GaP layer in physical contact with the nitrogen-doped n-type GaP layer is in the range of from $5 \times 10^{17}$ cm$^{-3}$ to $20 \times 10^{17}$ cm$^{-3}$.

2. A GaP green light-emitting diode comprising an n-type GaP single-crystal substrate, and at least an n-type GaP layer, a nitrogen-doped n-type GaP layer and a p-type GaP layer that are formed on the substrate in the order mentioned, wherein a concentration of sulfur in the nitrogen-doped n-type GaP layer is not more than $6 \times 10^{15}$ cm$^{-3}$, and an acceptor concentration of the p-type GaP layer in physical contact with the nitrogen-doped n-type GaP layer is in the range of from $5 \times 10^{17}$ cm$^{-3}$ to $20 \times 10^{17}$ cm$^{-3}$.

3. A GaP green light-emitting diode according to claim 1, wherein a concentration of sulfur in the nitrogen-doped n-type GaP layer is not more than $6 \times 10^{15}$ cm$^{-3}$.

4. A GaP green light-emitting diode according to claim 1, wherein a concentration of silicon in the nitrogen-doped n-type GaP layers is in the range of 1 to $2 \times 10^{16}$ cm$^{-3}$.

5. A GaP green light-emitting diode according to claim 2, wherein a concentration of silicon in the nitrogen-doped n-type GaP layer is in the range of 1 to $2 \times 10^{16}$ cm$^{-3}$.

6. A GaP green light-emitting diode according to claim 3, wherein a concentration of silicon in the nitrogen-doped n-type GaP layer is in the range of 1 to $2 \times 10^{16}$ cm$^{-3}$.

7. A GaP green light-emitting diode according to claim 1, wherein the n-type GaP layer doped with nitrogen has a donor impurity concentration higher in a vicinity of an interface with the p-type GaP layer than in a vicinity of an interface with the n-type GaP layer not doped with nitrogen.

8. A GaP green light-emitting diode according to claim 2, wherein the n-type GaP layer doped with nitrogen has a donor impurity concentration higher in a vicinity of an interface with the p-type GaP layer than in a vicinity of an interface with the n-type GaP layer not doped with nitrogen.

* * * * *